United States Patent [19]

Krause et al.

[11] 4,239,368

[45] Dec. 16, 1980

[54] APPARATUS FOR DEVELOPING PRINTING PLATES COMPRISING A TANK IN WHICH PROCESSING LIQUID IS CONTAINED

[75] Inventors: Dieter Krause; Dieter Töpfer, both of Wiesbaden; Wolfgang Salzburg, Kriftel, all of Fed. Rep. of Germany

[73] Assignee: Hoechst Aktiengesellschaft, Fed. Rep. of Germany

[21] Appl. No.: 21,790

[22] Filed: Mar. 19, 1979

[30] Foreign Application Priority Data

Mar. 18, 1978 [DE] Fed. Rep. of Germany ... 7808341[U]

[51] Int. Cl.³ ............................................. G03D 3/06
[52] U.S. Cl. .................................. 354/325; 354/331; 134/111
[58] Field of Search ............... 354/324, 325, 317, 318, 354/319, 320, 321, 322, 331, 332, 333, 337, 338; 134/104, 111, 115, 165

[56] References Cited

U.S. PATENT DOCUMENTS

| 2,288,325 | 6/1942 | Rodier | 354/342 |
|---|---|---|---|
| 3,327,721 | 6/1967 | Carlson | 134/111 |
| 3,463,173 | 8/1969 | Goldman | 134/165 |
| 3,641,911 | 2/1972 | Aelterman et al. | 134/64 P |
| 3,776,800 | 12/1973 | Goffredo et al. | 134/104 |
| 3,990,088 | 11/1976 | Takita et al. | 354/324 |
| 4,056,114 | 11/1977 | Boutillette | 134/104 |
| 4,104,668 | 8/1978 | Laar | 354/324 |
| 4,145,135 | 3/1979 | Sara | 354/324 |
| 4,150,679 | 4/1979 | Cushing et al. | 134/111 |

*Primary Examiner*—Richard A. Wintercorn
*Assistant Examiner*—Alan Mathews
*Attorney, Agent, or Firm*—James E. Bryan

[57] ABSTRACT

This invention relates to an improvement in apparatus for developing printing plates, comprising at least one tank in which a processing liquid is contained and at least one filter means through which the processing liquid is passed on its flow path from or to the tank, the improvement comprising means mounting the filter means within the tank without a filter housing of its own, and means mounting the tank on carriage means which can be withdrawn from the apparatus.

8 Claims, 4 Drawing Figures

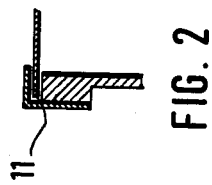
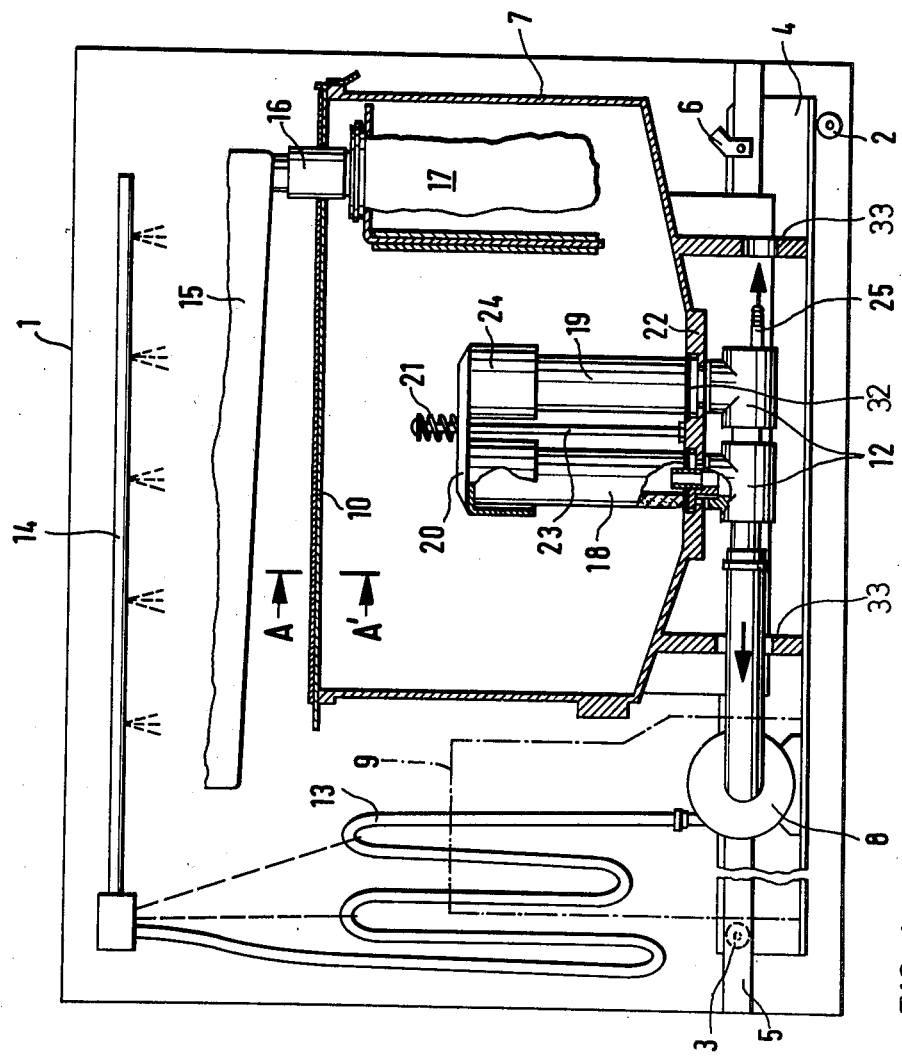

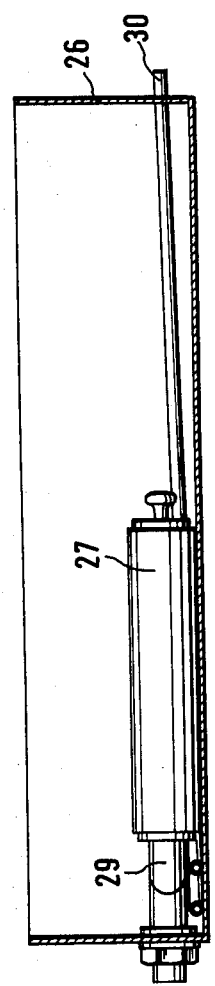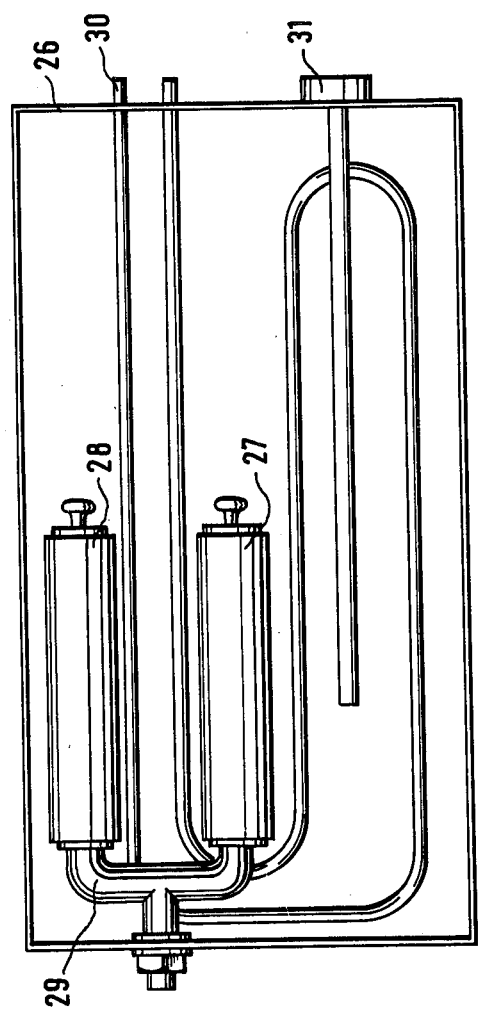
FIG. 3
FIG. 4

APPARATUS FOR DEVELOPING PRINTING PLATES COMPRISING A TANK IN WHICH PROCESSING LIQUID IS CONTAINED

The present invention relates to an apparatus for developing printing plates which comprises at least one tank in which a processing liquid is contained and at least one filter through which the processing liquid is passed on its flow path from and/or to the tank.

In known apparatuses of this type, the processing liquid used for developing printing plates is pumped from the tank by means of a circulating pump and is conveyed to a processing station which may be composed, e.g., of a spray tube which may be combined with brushes and/or wipers, or of a basin through which the printing plate to be developed is passed. At least one filter is arranged in the flow path between the tank and the printing plate processing station, to protect the printing plate being developed from dirt particles and loosened particles of the layer which are washed away with the processing liquid. Normally, the filter is positioned on the delivery side of a circulating pump.

The processing liquid supplied to the printing plate processing station is returned to the tank through a return pipe which also may contain a filter. The processing liquid may be a liquid developer, but liquids used for the after-treatment of the developed printing plate, especially for the formation of a protective layer thereon, also may be applied.

In the known apparatuses of this type for developing printing plates, the tanks and the filters of the filter station are fixedly mounted in the apparatus. Further units which serve to keep the processing liquid at the desired temperature and the desired level within the tank and a circulating pump used for conveying the processing liquid from the tank to the processing station are also in fixed positions in the apparatus.

Because they are not easily accessible within the apparatus, an orderly maintenance of the tanks, i.e. cleaning, checking, and filling them so that a sufficient quantity of uncontaminated chemicals is always present in the printing plate processing station, proves difficult. The problem is particularly serious in apparatuses through which the printing plates to be developed pass in the horizontal direction, because these apparatuses are particularly cramped for space. In one of the known apparatuses, the fixedly mounted tanks must be filled and cleaned from the front of the entire apparatus. For this purpose, the operator must work in a stooped position under a fixed feed table and under relatively poor conditions of light. One of the above-mentioned problems is the servicing of the filters. In the known apparatus, in which the filters, especially the fine-mesh filters, are each accommodated in a filter housing located outside of the tanks in the feed pipes to the processing station, it is particularly difficult to remove the filter cartridges, which must be replaced from time to time. Before removing the separate filter housings which surround the filter cartridges, it is necessary to drain the processing liquid from the filter, which means, in most cases, that the processing liquid also must be drained from the higher level section of the feed pipe. The drained processing liquid must be collected, if it is to be avoided that it flows into the interior of the apparatus or drips to the bottom.

It is the object of the present invention to provide an apparatus for developing printing plates comprising a tank in which a processing liquid is contained, wherein the tank and the filter or filters can be serviced, i.e. cleaned, checked, and filled, in a simple and convenient and nevertheless thorough manner, including the replacement of the filter cartridges.

According to the present invention, this object is achieved for an apparatus for developing printing plates of the initially described type in that the filter is arranged within the tank, without a filter housing of its own, and that the tank is mounted on a carriage which can be withdrawn from the apparatus.

With the apparatus according to the present invention, the necessary servicing jobs can be performed in a particularly simple, time-saving and thorough manner, because, by withdrawing the carriage, the tank and the filters positioned in the interior thereof can be virtually completely exposed, so that these units are easily accessible from several sides. After completion of the maintenance work, the slidable carriage and the units carried thereon can be re-inserted into the apparatus, so that these units completely disappear in the apparatus. The arrangement of the filter(s) within the tank has additional essential advantages, because a separate filter housing surrounding the filter cartridges can be omitted, so that the volume of developer liquid may be reduced, because there is no filter housing to form an additional space which is to be filled with developer liquid. There is no soiling of the interior of the apparatus when the filter cartridges are replaced, because the filters are arranged in the interior of the tank, which forms a fluid-tight seal from the outside. As a further advantage of this arrangement of the filter or filters, not only the filter housing can be omitted, but also the mountings of the housings and the seals where the pipes enter the filter housings.

According to a particularly advantageous embodiment of the apparatus according to the invention, in which a lid is provided in the normal manner to cover the tank and a tube reaches through the lid into the tank, the lid is fixedly mounted in the apparatus and guide means are provided in which the lid is guided when the tank is displaced together with the carriage.

In this embodiment of the invention, when the tank is withdrawn from the apparatus on the carriage, the lid is held in the position in which it is mounted and slides in the guide means provided at the top of the tank. Thus, when the tank is pushed back on the carriage, the lid is automatically returned to its original position, so that it covers the upper side of the tank. Advantageously, the return pipe is arranged so that it remains within the tank when the tank is withdrawn from the apparatus. This means that in the inserted position of the tank, the tube is located near its front end—when viewed in the direction in which the carriage is withdrawn—while it will be near the rear end of the tank when the tank is withdrawn to the stop position of the carriage. Together with the end of the tube, an antefilter which may be attached to it remains within the tank in each position of the tank. This embodiment of the invention is thus distinguished in that the interior of the tank and the filters arranged therein become accessible by the withdrawal of the carriage from the apparatus and that there is no need for a separate, tiresome handling of the lid.

According to a particularly advantageous embodiment, the apparatus according to the invention is distinguished by the feature that the carriage is laterally withdrawn from the apparatus, transversely to the direction in which the printing plates are conveyed.

In this embodiment of the apparatus, the accessibility of the withdrawn tank and of the filters arranged in the interior thereof is not impaired by a feed table. Furthermore, it is thus possible for several tanks to be arranged beneath the printing plate processing stations associated with them in a manner such that the feed pipe leading to each processing station can be very short and that the tanks can be withdrawn from the apparatus without interfering with each other.

In order to ensure maximum convenience in the withdrawal and insertion of the carriage with the machine elements and units mounted thereon, the carriage is advantageously supported on rollers.

A particularly advantageous embodiment of the present invention is one based on a known apparatus of the above-mentioned type which comprises a circulating pump by means of which processing liquid may be drawn from the tank and supplied to a printing plate processing station and which may further comprise heating and cooling means for the processing liquid and means for maintaining it at a certain level in the tank. The particularly advantageous further development of this known apparatus is that the tank is arranged at the front end of the carriage, viewed in the direction of withdrawal, and that the circulating pump and possibly further means for heating or cooling the liquid or for maintaining the level thereof are arranged behind the tank on the carriage; that the path of travel of the carriage includes at least one stop against which the carriage abuts when it is withdrawn from the apparatus to the stop position so that the tank is accessible; and that the stop is so designed that it can be removed by releasing a locking mechanism, so that the carriage can be completely withdrawn from the apparatus.

In this embodiment of the invention, the withdrawable carriage carries not only the tank, but further units are arranged thereon which also should be easily accessible, when necessary, although at longer time intervals. In order to service the tank and the filters positioned therein, the carriage may be normally withdrawn from the apparatus to a first stop position in which the stop becomes effective. This stop position is sufficient to enable an operator to thoroughly service the tank and the filters in a convenient manner. If more complicated work or repairs are to be performed, especially those involving the circulating pump or the devices provided for heating or cooling the processing liquid or for maintaining it at a certain level—which work advantageously should be performed by a servicing engineer—the stop must be removed from the path of travel of the carriage before starting the work, by releasing the locking mechanism of the stop. Now the carriage may be completely withdrawn from the apparatus, so that the further units, e.g. a heating unit, a solenoid valve within a cooling water duct, a float switch controlling the liquid level, or the sensor of a thermostat, become easily accessible.

Advantageously, the apparatus is so designed that the filters arranged within the tank are an antefilter and at least one fine-mesh filter and that the antefilter is positioned below the opening of the tube which projects into the tank through the lid.

The antefilter is thus arranged in the return pipe, whereas the fine-mesh filters are positioned on the suction side of the circulating pump provided in the flow path.

Further, according to a first advantageous version of the invention, the fine-mesh filter is composed of at least one filter cartridge which is arranged in an upright position on the bottom of the tank, above an intake stack passing through the bottom of the tank, and the filter cartridge is sealed from the bottom by a packing.

This arrangement guarantees a particularly easy accessibility of the fine-mesh filter, provided the tank is high enough to accommodate the upright filter cartridges. The fasteners for the filter cartridges preferably are arranged at the top of the cartridges.

In an advantageous embodiment of the first version of the invention, a sealing cap is provided which is slipped over the upper portion of the filter cartridge.

As long as the cap extends below the lowest permissible level of the tank, it is thus ensured that, although the level of the liquid contained in the tank drops during operation of the apparatus for developing printing plates, no air is drawn into the uprightly positioned filter cartridges.

A particularly easily accessible and safe attachment of the upright filter cartridge according to the first version is achieved, if the filter cartridge is fastened by a swivelling bracket which can be swiveled about a stay bolt attached to the bottom of the tank and is forced against the upper surface of the filter cartridge by a spring which bears against the head of the stay bolt.

The filter cartridges—which advantageously are arranged side by side, in pairs—are thus attached by swiveling the bracket over them and pressing it on the upper surface of the filter cartridge.

According to a second version, which is of particular advantage in those cases where the tanks are not high enough to accommodate upright filter cartridges, the fine-mesh filter is composed of at least one filter cartridge which is horizontally arranged, near the bottom of the tank.

In the following, two versions of the present invention will be further illustrated by reference to the four figures of the accompanying drawings:

FIG. 1 shows the first version of the apparatus according to the invention, wherein upright filter cartridges are arranged in a tank and the tank is inserted into the apparatus for developing printing plates, FIG. 2 shows, in section, the guide means of a lid, viewed in the direction AA' of FIG. 1, FIG. 3 shows, in longitudinal section, the tank of a second version of the inventive apparatus, in which the filter cartridges are arranged in a horizontal position, and FIG. 4 is a top view of a tank in which the filter cartridges are horizontally positioned.

In FIG. 1, numeral 1 designates the casing of an apparatus for developing printing plates. A carriage 4 supported on the rollers 2, 3 is arranged within the casing. The two rollers 2 and 3 slide in tracks, of which track 5 is indicated in the drawing.

The carriage 4 may be withdrawn from the casing 1 until the roller 3 running in the track 5 abuts against the stop 6. If the carriage is to be further withdrawn from the casing, the stop 6 must be removed from the path of travel of the roller 3 by releasing a locking mechanism (not shown).

The carriage 4 carries a tank 7 which is fixedly mounted near the front end of the carriage, and a circulating pump 8 and, if desired, further units indicated by a box 9 shown as a broken line, which are arranged at the rear of the carriage. Such units may be a heater, a solenoid valve for a cooling water pipe line, a float switch to control the level of the liquid, and/or the sensor of a thermostat.

A lid 10 is fixedly mounted above the tank 7, and the tank is mounted for displacement with regard to the lid, in that the lid 10 extends into a guide means 11, as illustrated by FIG. 2.

The tank 7 is supported by legs 33 on the bottom of the casing 1.

By means of a double intake stack 12, the interior of the tank 7 is connected with the intake side of the circulating pump 8. The delivery side of the circulating pump 8 is connected, through an extensible tube 13, with a spray tube 14 arranged above an inclined collecting trough 15.

The lowest point of the collecting trough 15 is connected with a return pipe 16 which extends into the interior of the tank 7 through the lid 10. The opening of the return pipe 16 is closed by an antefilter 17 which serves as a coarse filter and may consist of a lady's stocking.

Furthermore, two upright filter cartirdges 18 and 19 are arranged side by side within the tank 7 in a manner such that the intake stack 12 extends into the filter cartridges. The filter cartridges are designed as fine-mesh filters. They are fastened by means of a bracket 20 which forces the filter cartridges against the bottom 22 of the tank 7 under the action of a spring 21. The pressure exerted by the spring is absorbed by a stay bolt 23 which is attached to the bottom 22 and whose head end serves as an abutment for the spring 21.

Each of the filter cartridges 18, 19 is sealed from the bottom 22 by a packing 32; alternatively, it is possible to use a single overall packing for sealing all cartridges.

Furthermore, a cap 24 is slipped over the top of each filter cartridge, so that no air is drawn in when the level of liquid drops during operation of the apparatus, provided the level does not drop below the cap.

FIG. 1 also shows a connection 25 for a drain cock (not shown), which is provided to remove residual liquid from the tank.

FIGS. 3 and 4 show a second version of the inventive apparatus wherein the filter cartridges are horizontally arranged in the tank 26. The filter cartridges 27 and 28 are connected with the circulating pump 8 by a manifold 29.

Furthermore, FIGS. 3 and 4 show a pipe 30 through which a medium for heating or cooling the processing liquid may flow. Finally, FIG. 4 shows a thermostat 31 by which the temperature of the processing liquid is adjusted. The thermostat 31 and the pipe 30 act together with heating or cooling units which are accomodated in the space taken by box 9 in FIG. 1.

It will be obvious to those skilled in the art that many modifications may be made within the scope of the present invention without departing from the spirit thereof, and the invention includes all such modifications.

What is claimed is:

1. In apparatus for developing printing plates, comprising at least one tank in which a processing liquid is contained and at least one filter means through which the processing liquid is passed on its flow path from or to the tank, the improvement comprising means mounting the filter means within the tank without a filter housing of its own, means mounting the tank on carriage means which is supported on roller means and is adapted to be withdrawn from the apparatus, said tank means including lid means which covers the tank and through which a tube extends into the tank, said lid means being fixedly mounted in guide means in the apparatus, and further including track means against which said roller means are adapted to run to guide the carriage means which is displaceable together with the tank.

2. Apparatus according to claim 1 including circulating pump means whereby the processing liquid can be drawn from the tank and supplied to a printing plate processing station, means for heating or cooling the processing liquid, further including means for maintaining the processing liquid level in the tank, said tank being mounted near a front end of the carriage means, when viewed in the direction in which it is adapted to be withdrawn, said circulating pump means means for heating or cooling the processing liquid and means for maintaining the processing liquid level being mounted behind the tank on the carriage means, and further including at least one stop means provided in the path of travel of the carriage means against which the carriage means abuts when it is withdrawn from the apparatus to a stop position in which the tank is accessible, said stop means being so designed that it can be removed by releasing a locking mechanism, whereby the carriage means can be completely withdrawn from the apparatus.

3. Apparatus according to claim 1 including elongated spray tube means and means whereby the carriage may be laterally withdrawn from the apparatus, parallel to said spray tube means.

4. Apparatus according to claim 1 in which the filter means in the tank include an antefilter and at least one fine-mesh filter, an opening in said tube which extends through the lid means into the tank, and said antefilter being positioned below said opening of the tube.

5. Apparatus according to claim 4 in which the fine-mesh filter is at least one upright filter cartridge which stands on the bottom of the tank above an intake stack passing through said bottom, said filter cartridge being sealed from said bottom by a packing.

6. Apparatus according to claim 5 including a sealing cap slipped over the top of the filter cartridge.

7. Apparatus according to claim 5 including a swiveling bracket fastening said filter cartridge, said bracket being adapted to be swiveled about a stay bolt attached to the bottom of said tank and being forced against an upper surface of said filter cartridge by a spring which bears against the head of the stay bolt.

8. Apparatus according to claim 4 in which the fine-mesh filter is at least one filter cartridge horizontally mounted near the bottom of the tank.

* * * * *